United States Patent
Lo

(10) Patent No.: US 6,304,453 B1
(45) Date of Patent: Oct. 16, 2001

(54) HEAT SINK ASSEMBLY

(75) Inventor: We-Ta Lo, Miou-Li (TW)

(73) Assignee: Foxconn Precision Components Co., Ltd., Taipei Hsien (TW)

(*) Notice: Subject to any disclaimer, the term of this patent is extended or adjusted under 35 U.S.C. 154(b) by 0 days.

(21) Appl. No.: 09/686,360

(22) Filed: Oct. 10, 2000

(30) Foreign Application Priority Data

May 30, 2000 (TW) .............................................. 089209213

(51) Int. Cl.⁷ ...................................................... H05K 7/20
(52) U.S. Cl. ............................ 361/704; 361/707; 361/709; 165/80.3; 174/16.3; 257/718; 257/719; 257/727; 411/516; 411/522; 411/523; 24/458
(58) Field of Search ..................................... 361/702–704, 361/707, 709, 690, 694, 695, 697, 717–719; 165/80.3, 185; 257/706, 707, 712, 713, 718, 719, 727; 174/16.3; 24/457, 520, 458; 411/516, 522, 523, 524

(56) References Cited

U.S. PATENT DOCUMENTS

| | | | |
|---|---|---|---|
| 5,304,735 | * | 4/1994 | Earl et al. .......................... 174/16.3 |
| 5,684,676 | * | 11/1997 | Lin ....................................... 361/704 |
| 6,205,026 | * | 3/2001 | Wong et al. .......................... 361/704 |

* cited by examiner

Primary Examiner—Leo P. Picard
Assistant Examiner—Boris L. Chervinsky
(74) Attorney, Agent, or Firm—Wei Te Chung

(57) ABSTRACT

A heat sink assembly includes a heat sink (30), a clip (40) and two pairs of holders (50). The heat sink has a base (31) and a plurality of fins (32) extending from the base. A groove (34) is defined in each of two opposite side surfaces (36) of the base. The clip presses the heat sink onto an electronic device (60) mounted on a socket (70). Each holder has a fixing portion (51) for being interferentially inserted into the groove of the heat sink, and a positioning portion (52) for engaging with a side edge of the socket. The heat sink is thereby prevented from moving with respect to the electronic device.

6 Claims, 3 Drawing Sheets

HEAT SINK ASSEMBLY

BACKGROUND

1. Field of the Invention

The present invention relates to a heat sink assembly, and particularly to a heat sink assembly having holders for securely retaining a heat sink on a heat-generating electronic device.

2. The Related Art

Many electronic devices, such as Central Processing Units (CPUs) generate large amounts of heat during operation. The heat frequently deteriorates the operational stability of the electronic devices. A heat sink is often attached to a CPU to remove heat therefrom. Various clips have been used for attaching a heat sink to a CPU.

FIG. 3 shows a conventional clip 16 attaching a heat sink 10 to a CPU 13. A ridge 12 extends downwardly from a bottom surface of the heat sink 10, and is received in a gap 18 between a connector 14 and the CPU 13. When this assembly is subjected to shock, the ridge 12 cooperates with the clip 16 to prevent the heat sink 10 from moving with respect to the CPU 13. However, the gap 18 is relatively narrow, and the corresponding ridge 12 is sometimes too small to properly secure the heat sink 10 under shock conditions. Furthermore, the size of the ridge 12 must be precisely manufactured, to ensure that it accurately mates with the gap 18.

Therefore, a heat sink assembly is desired to solve the above-mentioned problems.

SUMMARY OF THE INVENTION

Accordingly, an object of the present invention is to provide a heat sink assembly having a plurality of holders for preventing the heat sink from moving when subjected to shock.

Another object of the present invention is to provide a heat sink assembly which is readily attached to an electronic device, and readily detached therefrom.

To achieve the above-mentioned objects, a heat sink assembly in accordance with the present invention comprises a heat sink, a clip and two pairs of holders. The heat sink has a base and a plurality of fins extending perpendicularly from the base. A groove is defined in each of two opposite side surfaces of the base. The clip presses the heat sink onto an electronic device mounted on a socket. Each holder has a fixing portion for being interferentially inserted into the groove of the heat sink, and a positioning portion for engaging with a side surface of the socket. Thus the clip and the four holders prevent the heat sink from moving with respect to the electronic device.

Other objects, advantages and novel features of the present invention will be drawn from the following detailed embodiment of the present invention with attached drawings, in which:

DESCRIPTION OF THE PREFERRED EMBODIMENT

Figure 1:
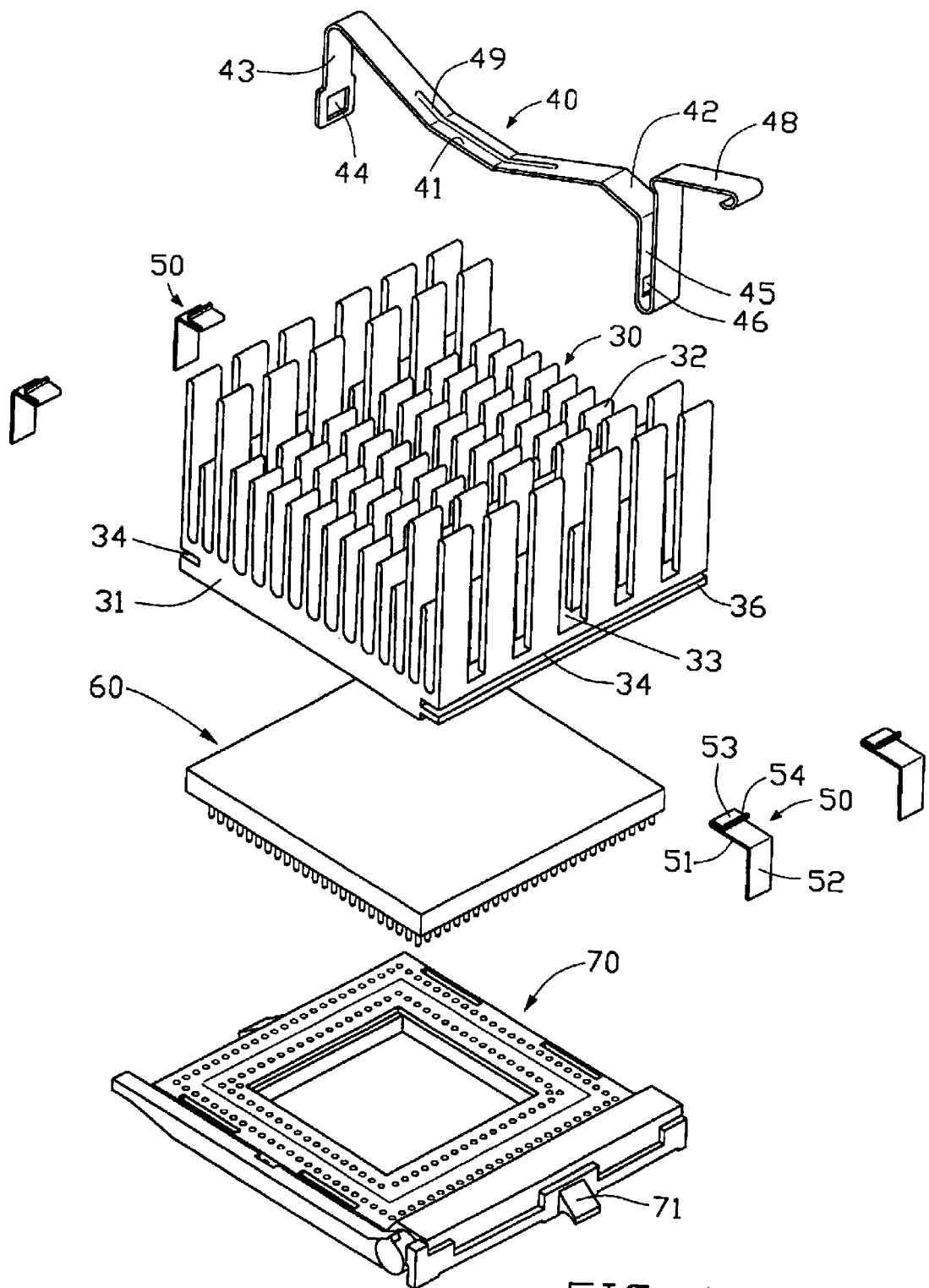
FIG. 1 is an exploded view of a heat sink assembly of the present invention, and a CPU to be mounted on a socket.

Referring to FIG. 1, a heat sink assembly of the present invention comprises a heat sink 30, a clip 40 and two pairs of holders 50. Cooperating with the holders 50, the clip 40 attaches the heat sink 30 to a CPU 60 mounted on a socket 70.

The heat sink 30 has a base 31 and a plurality of fins 32 extending perpendicularly from the base 31. The base 31 defines a groove 34 in each of two opposite side surfaces 36 of the base 31, for receiving the holders 50. A center trench 33 extends across the heat sink 30 between the fins 32, for accommodating the clip 40.

The clip 40 is formed from a single piece of resilient metal by stamping. The clip 40 comprises a pressing body 41, a first spring arm 43 extending downwards from one end of the pressing body 41, a horizontal section 42 at the other end of the pressing body, and a second spring arm 45 extending downwards from the other end of the pressing body 41 at the free end of the horizontal section 42. The pressing body 41 forms a central rib 49 to reinforce the clip 40. The first and second spring arms 43, 45 each define an aperture 44, 46 for engaging with a respective catch 71 of the socket 70. A free end of the second spring arm 45 extends upwards and then horizontally to form an L-shaped handle 48. The end of the handle 48 is bent in an arc for facilitating handling. The clip 40 has a width slightly less than the width of the center trench 33 of the heat sink 30, so that the clip 40 slidingly engages with those edges of the fins 32 of the heat sink 30 which border the center trench 33.

The holders 50 are L-shaped, and include a horizontal fixing portion 51 and a positioning portion 52 depending vertically from one end of the fixing portion 51. The fixing portion 51 forms a resilient U-shaped spring 53 at the other end of the fixing portion 51. The spring 53 is elastically deformable to interferetially engage with the corresponding groove 34 of the heat sink 30. A tab 54 extends perpendicularly from the free end of the spring 53.

Figure 2:
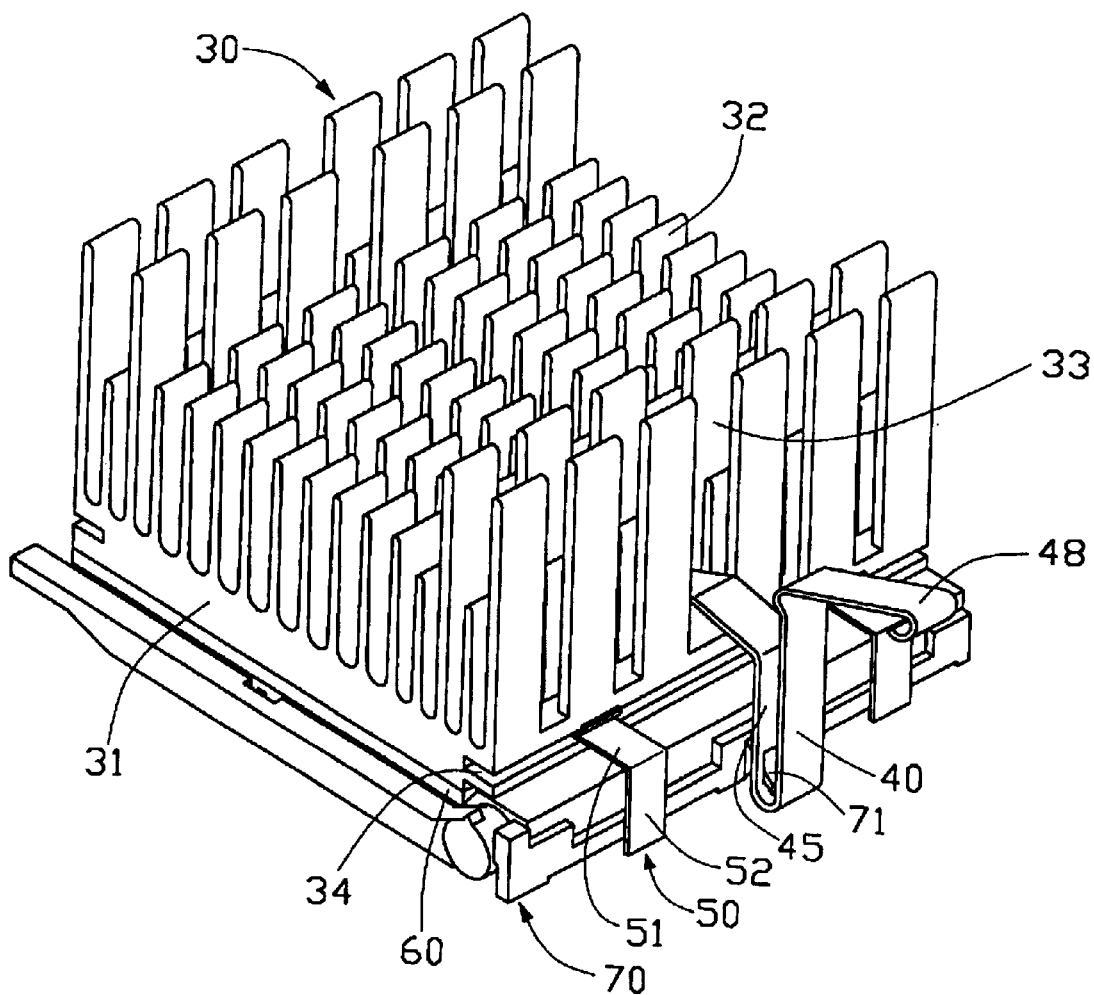
FIG. 2 is an assembled view of FIG. 1.
Figure 3:
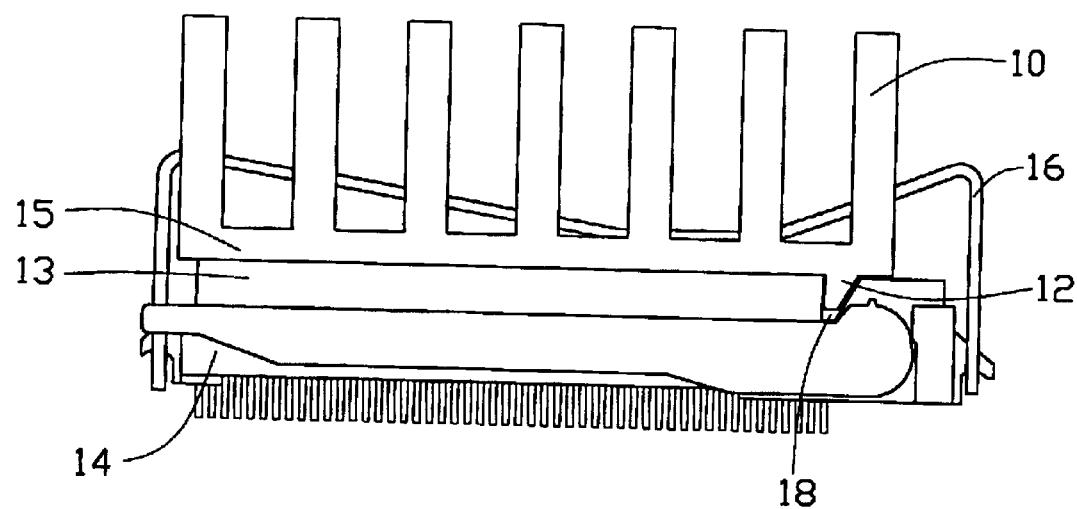
FIG. 3 shows a conventional clip securing a heat sink to a CPU mounted on a socket.

Referring to FIG. 2, in assembly, the CPU 60 is mounted on the socket 70. The heat sink 30 is placed on top of the CPU 60 and the clip 40 is inserted in the trench 33 of the heat sink 30. The aperture 44 of the first spring arm 43 of the clip 40 engages with the catch 71 on the socket 70. The handle 48 is pressed downwards, and the aperture 46 of the second spring arm 45 readily engages with the other catch 71 of the socket 70. A pair of holders 50 is inserted into each groove 34, until the positioning portion 52 of each holder 50 abuts against a side surface (not labeled) of the socket 70. The tab 54 of each holder 50 abuts against the side surface 36 of the heat sink 30, thereby preventing the fixing portion 51 of the holder 50 from being overinserted into the groove 34 of the heat sink 30.

The positioning portions 52 of the holders 50 prevent the heat sink 30 from moving in a lateral direction parallel to a longitudinal axis of the clip 40. The clip 40, being slidingly engaged in the trench 33 of the heat sink 30, also prevents movement of the heat sink 30 in a lateral direction perpendicular to the longitudinal axis of the clip 40. Moreover, the pressing body 41 exerts downward pressure on the heat sink 30, thereby preventing the heat sink 30 from moving in a direction perpendicular to the plane of the CPU 60. Thus the heat sink 30 is firmly secured to the CPU 60, thereby rendering the entire assembly shock-proof.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink assembly comprising:

a heat sink having a base and a plurality of fins extending from the base, the base having at least a side surface with at least a groove defined therein;

a clip adapted to attach the heat sink onto an electronic device mounted on a socket; the clip has at least a pressing body for pressing the heat sink against the electronic device, and first and second spring arms extending from opposite ends of the pressing body for engaging with the socket and at least one holder having a fixing portion for being interferentially inserted into the groove of the heat sink and having a positioning portion adapted for engaging with the socket, thereby preventing the heat sink from moving with respect to the electronic device.

2. The heat sink assembly as described in claim 1, wherein a handle extends from a free end of the second spring arm, for facilitating attachment of the clip to the socket and detachment of the clip from the socket.

3. The heat sink assembly as described in claim 2, wherein the handle is bent to be L-shaped.

4. The heat sink assembly as described in claim 1, wherein the holder is L-shaped.

5. The heat sink assembly as described in claim 1, wherein the fixing portion forms at least a resilient U-shaped spring which elastically deforms to interferentially engage with the groove of the heat sink.

6. The heat sink assembly as described in claim 5, wherein at least a tab extends perpendicularly from the U-shaped spring.

* * * * *